US011515246B2

(12) United States Patent
Chetlur et al.

(10) Patent No.: US 11,515,246 B2
(45) Date of Patent: Nov. 29, 2022

(54) DUAL CIRCUIT DIGITAL ISOLATOR

(71) Applicant: Allegro MicroSystems, LLC, Manchester, NH (US)

(72) Inventors: Sundar Chetlur, Bedford, NH (US); Maxim Klebanov, Manchester, NH (US); Cory Voisine, Manchester, NH (US); Kenneth Snowdon, Stratham, NH (US); Hsuan-Jung Wu, Taoyuan (TW)

(73) Assignee: Allegro MicroSystems, LLC, Manchester, NH (US)

( * ) Notice: Subject to any disclaimer, the term of this patent is extended or adjusted under 35 U.S.C. 154(b) by 55 days.

(21) Appl. No.: 17/067,178

(22) Filed: Oct. 9, 2020

(65) Prior Publication Data
US 2022/0115316 A1 Apr. 14, 2022

(51) Int. Cl.
*H01L 23/522* (2006.01)
*H01L 21/8234* (2006.01)

(52) U.S. Cl.
CPC .. *H01L 23/5222* (2013.01); *H01L 21/823493* (2013.01)

(58) Field of Classification Search
None
See application file for complete search history.

(56) References Cited

U.S. PATENT DOCUMENTS

| 4,419,713 A | 12/1983 | Levinson |
| 5,812,363 A | 9/1998 | Kuroda et al. |
| 5,942,895 A | 8/1999 | Popovic et al. |
| 6,545,462 B2 | 4/2003 | Schott et al. |
| 6,603,807 B1 | 8/2003 | Yukutake et al. |
| 6,781,359 B2 | 8/2004 | Stauth et al. |
| 6,873,065 B2 | 3/2005 | Haigh et al. |
| 7,161,264 B2 * | 1/2007 | Kanekawa ............. H01L 21/84 257/E27.111 |
| 7,772,838 B2 | 8/2010 | Bailey et al. |
| 7,936,164 B2 | 5/2011 | Doogue et al. |
| 8,169,108 B2 | 5/2012 | Dupuis et al. |
| 8,643,138 B2 | 2/2014 | Dong |
| 8,896,295 B2 | 11/2014 | Friedrich et al. |
| 9,514,879 B2 | 12/2016 | Pagani |

(Continued)

FOREIGN PATENT DOCUMENTS

| DE | 10 2013 100 622 A1 | 7/2014 |
| EP | 1 089 337 A1 | 4/2001 |

(Continued)

OTHER PUBLICATIONS

U.S. Non-Final Office Action dated Oct. 12, 2021 for U.S. Appl. No. 16/430,849; 16 Pages.

(Continued)

*Primary Examiner* — Benjamin P Sandvik
(74) *Attorney, Agent, or Firm* — Daly, Crowley, Mofford & Durkee, LLP

(57) ABSTRACT

An apparatus, comprising: a substrate; a coupling capacitor that is formed over the substrate; and an isolator that is formed between the substrate and the coupling capacitor, the isolator including: (a) an MP-well layer, (b) a first well layer, (c) an epi tub layer that is nested in the MP-well layer and the first well layer, and (d) a second well layer that is nested in the epi tub layer.

13 Claims, 14 Drawing Sheets

(56) References Cited

U.S. PATENT DOCUMENTS

| | | | |
|---|---|---|---|
| 9,660,848 | B2 | 5/2017 | Yun et al. |
| 10,074,939 | B1 | 9/2018 | Briano |
| 10,114,044 | B2 | 10/2018 | Geisler et al. |
| 10,753,968 | B2 | 8/2020 | Briano et al. |
| 2002/0117750 | A1 | 8/2002 | Kojima et al. |
| 2004/0008022 | A1 | 1/2004 | Viola et al. |
| 2006/0263727 | A1 | 11/2006 | Lee et al. |
| 2007/0080676 | A1 | 4/2007 | Racz et al. |
| 2008/0158777 | A1 | 7/2008 | Sohn et al. |
| 2008/0218258 | A1 | 9/2008 | Crawley et al. |
| 2009/0193295 | A1 | 7/2009 | Drost et al. |
| 2011/0148549 | A1 | 6/2011 | Kanschat et al. |
| 2012/0161841 | A1 | 6/2012 | Dong et al. |
| 2012/0181874 | A1 | 7/2012 | Willkofer et al. |
| 2013/0015839 | A1 | 1/2013 | Franke |
| 2013/0278077 | A1 | 10/2013 | Mueck |
| 2013/0278372 | A1 | 10/2013 | Stecher et al. |
| 2013/0335882 | A1 | 12/2013 | Ma et al. |
| 2014/0183698 | A1 | 7/2014 | Hsu et al. |
| 2014/0253225 | A1 | 9/2014 | Lee et al. |
| 2014/0264722 | A1 | 9/2014 | Nakashiba et al. |
| 2014/0325322 | A1 | 10/2014 | Kaeriyama |
| 2015/0061070 | A1 | 3/2015 | Shimizu |
| 2015/0200162 | A1 | 7/2015 | Constantino et al. |
| 2016/0080181 | A1 | 3/2016 | Yun et al. |
| 2016/0126367 | A1 | 5/2016 | Dunton et al. |
| 2016/0163692 | A1 | 6/2016 | Moghe et al. |
| 2016/0300907 | A1* | 10/2016 | Selvaraj ............... H01L 21/265 |
| 2017/0108559 | A1 | 4/2017 | Yuan et al. |
| 2017/0133841 | A1* | 5/2017 | Coyne ................ H01L 27/0259 |
| 2018/0059148 | A1 | 3/2018 | Geisler et al. |
| 2018/0245994 | A1 | 8/2018 | May |
| 2018/0306843 | A1 | 10/2018 | Bussing et al. |
| 2019/0265292 | A1 | 8/2019 | Briano et al. |
| 2020/0313637 | A1 | 10/2020 | Daubert et al. |
| 2020/0388581 | A1 | 12/2020 | Briano et al. |
| 2021/0048467 | A1 | 2/2021 | Briano |
| 2021/0057330 | A1 | 2/2021 | Briano et al. |

FOREIGN PATENT DOCUMENTS

| | | |
|---|---|---|
| EP | 1 180 800 A2 | 2/2002 |
| EP | 2 674 975 A1 | 12/2013 |
| EP | 3 293 889 A1 | 3/2018 |
| JP | 2001-036012 | 2/2001 |
| JP | 2006-115455 | 4/2006 |
| JP | 2006-279063 | 10/2006 |
| WO | WO 2012/065229 A1 | 5/2012 |
| WO | WO 2013/155565 A1 | 10/2013 |
| WO | WO 2014/036594 A1 | 3/2014 |

OTHER PUBLICATIONS

U.S. Non-Final Office Action dated Dec. 22, 2020 for U.S. Appl. No. 16/547,823; 12 Pages.
U.S. Appl. No. 17/659,687, filed Apr. 19, 2022, Briano et al.
U.S. Notice of Allowance dated Apr. 1, 2022 for U.S. Appl. No. 16/430,849; 8 Pages.
Extended European Search Report dated Oct. 12, 2020 for European Application No. 20174344.0; 21 Pages.
U.S. Non-Final Office Action dated Mar. 14, 2022 for U.S. Appl. No. 16/430,849; 11 Pages.
Response to U.S. Non-Final Office Action dated Mar. 14, 2022 for U.S. Appl. No. 16/430,849; Response filed Mar. 16, 2022; 9 Pages.
Response to Official Communication dated Mar. 15, 2021 and Extended European Search Report dated Feb. 4, 2021 for European Application No. 20188658.7; Response Filed Sep. 9, 2021; 10 Pages.

U.S. Final Office Action dated Mar. 26, 2021 for U.S. Appl. No. 16/547,823; 14 pages.
Response to U.S. Non-Final Office Action dated Dec. 22, 2020 for U.S. Appl. No. 16/547,823; Response filed Mar. 17, 2021; 12 pages.
Response to U.S. Final Office Action dated Mar. 26, 2021 for U.S. Appl. No. 16/547,823; Response Filed on Jun. 21, 2021; 10 Pages.
U.S. Advisory Action dated Jul. 1, 2021 for U.S. Appl. No. 16/547,823; 3 Pages.
Appeal Brief filed on Sep. 24, 2021 for U.S. Appl. No. 16/547,823; 18 Pages.
Akiyama et al., "A High-Voltage Monolithic Isolator for a Communication Network Interface;" IEEE Transactions on Electron Devices, vol. 49, No. 5; May 2002; 7 Pages.
Allegro MicroSystems, LLC A1367 Datasheet, Low-Noise, High-Precision, Programmable Lindear Hall-Effect Sensor IC with Regulated Supply, Advanced Temperature Compensation, and High-Bandwidth (240 kHz) Analog Output; A1367-DS, Rev. 2, dated Aug. 19, 2016; 27 pages.
Culurciello et al., "Monolithic Digital Galvanic Isolation Buffer Fabricated in Silicon on Sapphire CMOS;" Electronic Letters, vol. 41, No. 9; Apr. 28, 2005; 2 Pages.
Daughton, "Spin-Dependent Sensors;" Invited Paper; Proceedings of the IEEE, vol. 91, No. 5; May 2003; 6 Pages.
Knoedl, Jr. et al., "A Monolithic Signal Isolator;" Proceedings of the 4$^{th}$ Annual IEEE Applied Power Electronics Conference and Exposition; Mar. 13, 1989; pp. 165-170; 6 Pages.
MLX91208 IMC-Hall® Current Sensor (Triaxis®Technology), Melixis Inspired Engineering, 3901091208 Rev. 007, Jun. 2018; 20 pages.
Moghe et al., "Monolithic 2.5kV RMS, 1.8V-3.3V Dual Channel 640Mbps Digital Isolator in 0.5µm SOS;" Proceedings of the IEEE International SOI Conference; Oct. 1, 2012; 2 Pages.
U.S. Notice of Allowance dated Jun. 13, 2018 for U.S. Appl. No. 15/671,357; 12 Pages.
Extended European Search Report dated Jan. 4, 2019 for European Application No. 18185696.4; 5 Pages.
Response (with Amended Specification & Claims) to Extended European Search Report dated Jan. 4, 2019 for European Application No. 18185696.4; Response filed Jun. 4, 2019; 14 Pages.
European Examination Report dated Sep. 26, 2019 for European Application No. 18185696.4; 4 Pages.
Response (with Amended Claims) to European Examination Report dated Sep. 26, 2019 for European Application No. 18185696.4; Response filed Jan. 13, 2020; 7 Pages.
European Intention to Grant dated Apr. 20, 2020 for European Application No. 18185696.4; 6 Pages.
Office Action dated Nov. 23, 2020 for U.S. Appl. No. 16/385,111; 17 pages.
Response to Office Action filed on Feb. 8, 2021 for U.S. Appl. No. 16/385,111; 14 pages.
Final Office Action dated Mar. 18, 2021 for U.S. Appl. No. 16/385,111; 22 pages.
European Extended Search Report dated Sep. 25, 2020 for European Application No. 20166819.1; 7 pages.
Response to Official Communication filed on Mar. 30, 2021 for European Application No. 20166819.1; 17 pages.
Extended European Search Report dated Feb. 4, 2021 for European Application No. 20188658.7; 9 Pages.
U.S. Examiner's Answer dated Dec. 10, 2021 for U.S. Appl. No. 16/547,823; 5 Pages.
Response to U.S. Non-Final Office Action dated Oct. 12, 2021 for U.S. Appl. No. 16/430,849; Response filed Dec. 20, 2021; 15 Pages.
Reply Brief filed on Feb. 3, 2022 in response to Examiner's Answer dated Dec. 10, 2021 for U.S. Appl. No. 16/547,823; 7 Pages.
Response to Search Opinion dated Dec. 14, 2020 for European Application No. 20174344.0; Response filed on Jun. 15, 2021; 5 Pages.

* cited by examiner

US 11,515,246 B2

DUAL CIRCUIT DIGITAL ISOLATOR

BACKGROUND

As is known in the art, signal isolators can be used to transfer information across a barrier used to separate two or more voltage domains for safety or functional isolation. For example, capacitive coupling can be used to transfer information across a barrier. Optocouplers include a LED that emits light through an optically transparent insulating film and strikes a photo detector that generates a current flow that corresponds to the emitted light. RF carriers can also be used to transmit information across an isolation barrier.

SUMMARY

According to aspects of the disclosure, an apparatus, comprising: a substrate; a coupling capacitor that is formed over the substrate; and an isolator that is formed between the substrate and the coupling capacitor, the isolator including: (a) an MP-well layer, (b) a first well layer, (c) an epi tub layer that is nested in the MP-well layer and the first well layer, and (d) a second well layer that is nested in the epi tub layer.

According to aspects of the disclosure, an apparatus is provided, comprising: a substrate; a coupling capacitor that is formed over the substrate; and an isolator that is formed between the substrate and the coupling capacitor, the isolator including: (a) an MP-well layer, (b) a P-well layer, (c) an epi-tub layer that is nested in the MP-well layer and the P-well layer, and (d) an N-well layer that is nested in the epi-tub layer.

According to aspects of the disclosure, an apparatus is provided, comprising: a substrate; an isolator that is formed over the substrate, the isolator including a silicon shield layer that is formed between a first buried oxide (BOX) layer and a second BOX layer; a silicon layer having an oxide trench structure formed therein, the oxide trench structure being arranged to define a first silicon island a second silicon island; a first electronic circuit that is formed over the first silicon island; and a second electronic circuit that is formed over the second silicon island, the first electronic circuit being electrically coupled to the first electronic circuit.

BRIEF DESCRIPTION OF THE DRAWINGS

The foregoing features may be more fully understood from the following description of the drawings in which.

DETAILED DESCRIPTION

Figure 1A:
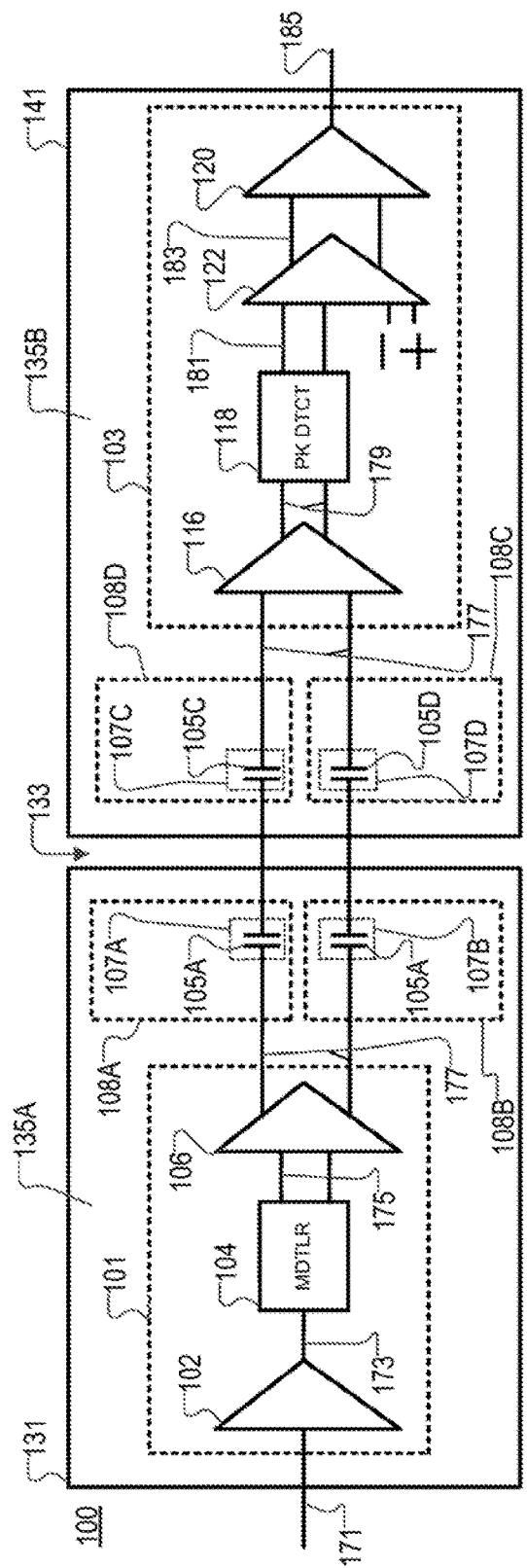
FIG. 1A is a circuit diagram of an example of a system, according to aspects of the disclosure.

FIG. 1A is a diagram of an example of a system 100, that includes a first semiconductor device 131 and a second semiconductor device 141. The first semiconductor device 131 may be part of a high-voltage domain and the second semiconductor device 141 may be part of a low-voltage domain. The first semiconductor device 131 and the second semiconductor device 141 may be physically separated from one another by an isolation boundary 133 (e.g., an air gap or a layer of insulating material).

The first semiconductor device 131 may include an electronic circuit 101 that is formed on a substrate 135A. The substrate 135A may include a p-type substrate, a silicon-on-isolation (SOI) substrate and/or any other suitable type of substrate. The first semiconductor device 131 may also include a structure 108A and a structure 108B. The structure 108A may include a coupling capacitor 105A that is formed over an isolator 107A. The isolator 107A may be formed over the substrate 135A, as shown. The structure 108B may include a coupling capacitor 105B that is formed over an isolator 107B. The isolator 107B may be formed over the substrate 135A, as shown. As is discussed further below, the isolators 107A and 107B may be configured to reduce parasitic capacitance that is formed between plates of the coupling capacitors 105 and the substrate 135A.

The second semiconductor device 141 may include an electronic circuit 103 that is formed on a substrate 135B. The substrate 135B may include a silicon-on-isolation (SOI) substrate, a p-type substrate and/or any other suitable type of substrate. The second semiconductor device 141 may also include a structure 108C and a structure 108D. The structure 108C may include a coupling capacitor 105C that is formed over an isolator 107A. The isolator 107C may be formed over the substrate 135B, as shown. The structure 108D may include a coupling capacitor 105D that is formed over an isolator 107B. The isolator 107D may be formed over the substrate 135B, as shown. The isolators 107C and 107D may be formed on the substrate 135B, and they may be configured to reduce parasitic capacitance that is formed between the plates of the coupling capacitors 105 and the substrate 135B.

The electronic circuit 101 may include an amplifier 102, a modulator 104, and an amplifier 106. The amplifier 102 may be configured to receive a signal 171 and amplify it to produce an amplified signal 173. The modulator 104 may modulate the amplified signal 173 to produce a modulated signal 175. The amplifier 106 may amplify the modulated signal 175 to produce an amplified signal 177. The amplified signal 177 may be subsequently transmitted to the electronic circuit 103 via the coupling capacitors 105A and 105B, as shown.

The electronic circuit 103 may include an amplifier 116, a peak detector 118, a differential comparator 122, and a differential-to-single-ended signal converter 120. The amplifier 116 may be configured to receive the signal 177 via the coupling capacitors 105C and 105D and amplify the signal 177 to produce an amplified signal 179. The peak detector 118 may generate a peak signal 181, based on the amplified signal 177. The differential comparator 122 may compare the peak signal 181 to a threshold and produce a differential signal 183 that indicates whether the peak signal 181 is above or below the threshold. The differential-to-single-ended signal converter 120 may convert the differential signal 183 to a single-ended signal 185, as shown.

In some respects, the electronic circuits 101 and 103 form a system for transmission of digital signals from a high-voltage domain to a low-voltage domain, in which the digital signals are transmitted via coupling capacitors 105. The coupling capacitors 105 are formed of metal plates with dielectric insulator between. The plates of the coupling capacitors may have an undesirable parasitic capacitance to the substrates 135A/135B, which could create a loss in the signals that are transmitted from the electronic circuit 101 to the electronic circuit 103. More particularly, parasitic capacitors that are formed between the bottom plates of the coupling capacitors 105 and the substrates 135A/135B may conduct potentially large current during common mode transient immunity (CMTI) events. During such events, large amounts of current can be injected or pulled from the substrate(s) 135A/135B when large transient voltages occur differentially in the parasitic capacitors. When large amounts of current are injected or pulled from the substrate(s) 135A/135B the electronic circuit 101 and/or the electronic circuit 103 can have a non-zero substrate-to-ground impedance, and its operation may be disturbed. To reduce the effects of parasitic capacitance on the operation of the electronic circuits 101 and 103, each of the coupling capacitors 105 may be formed over a respective isolator 107.

Figure 1B:
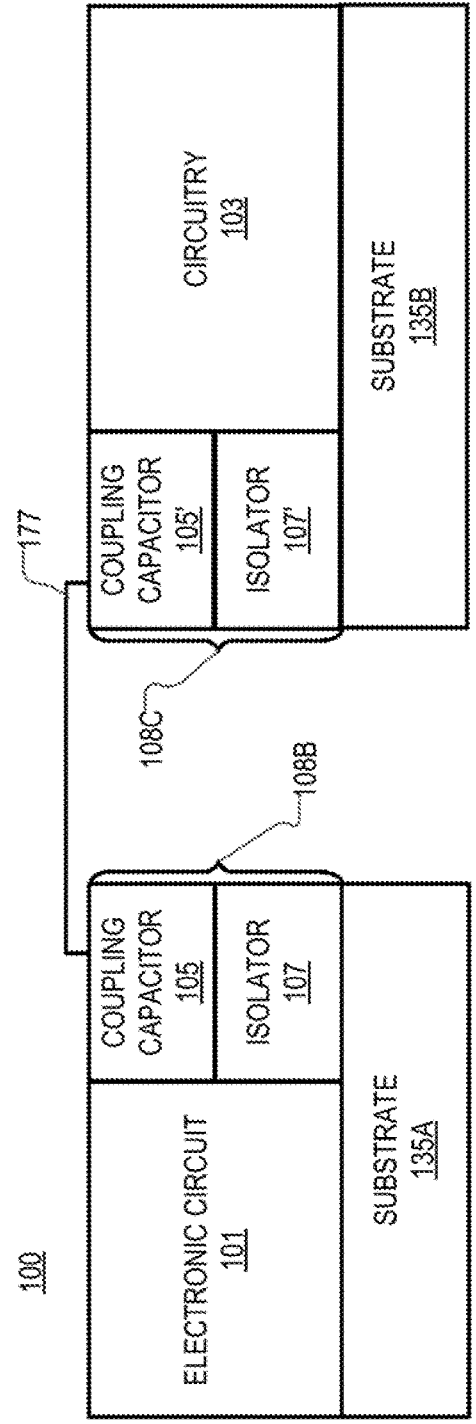
FIG. 1B is a schematic cross-sectional side view of the system of FIG. 1A, according to aspects of the disclosure.
Figure 1C:
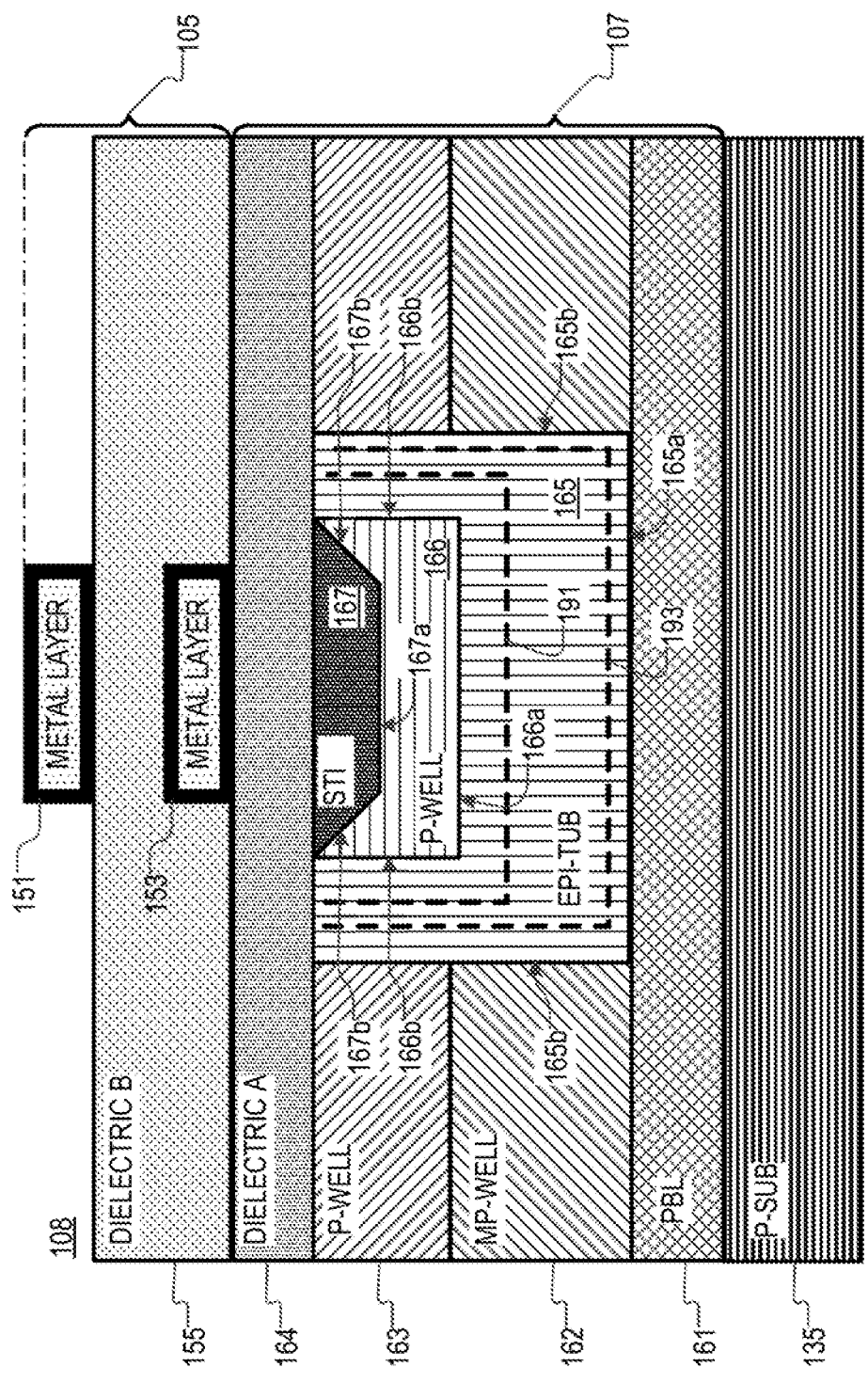
FIG. 1C is a schematic cross-sectional side view of an isolator and a coupling capacitor that are part of the system of FIG. 1A, according to aspects of the disclosure.

The structure of the coupling capacitors 105 and isolators 107 is now described in further detail. FIG. 1C shows a cross-sectional side view of a structure 108 when the structure 108 is viewed from a direction Y. The structure 108 may be formed over a substrate 135. The structure 108 may be the same or similar to any of the structures 108A-D, which are discussed above with respect to FIGS. 1A-D. The substrate 135 may be the same or similar to any of the substrates 135A and 135B, which are discussed above with respect to FIGS. 1-C. According to the present example, the structure 108 includes an isolator 107 that is formed over the substrate 135, and a coupling capacitor 105 that is formed over the isolator 107. The isolator 107 may be the same or similar to any of the isolators 107A-D, which are discussed above with respect to FIGS. 1A-B. The coupling capacitor 105 may be the same or similar to any of the coupling capacitors 105A-B, which are discussed above with respect to FIGS. 1A-B.

The isolator 107 may include a PBL layer 161, a Middle P-well layer 162 (hereinafter "MP-well layer 162", a P-well layer 163, a dielectric layer 164, an epi tub layer 165, an P-well layer 166, and a shallow trench isolation (STI) layer 167. The PBL layer 161 may be formed over the substrate 135. The MP-well layer 162 may be formed over the PBL layer 161. The P-well layer 163 may be formed over the MP-well layer 162. And the dielectric layer 164 may be formed over the P-well layer 163, as shown. The capacitor 105 may include metal layers 151 and 153 that are separated from one another by a dielectric layer 155. The metal layer 153 may be formed over the dielectric layer 164 and the metal layer 151 may be formed over the dielectric layer 155. Although in the example of FIGS. 1A-D, layers 163 and 166 are both P-well layers, alternative implementations are possible in which layers 163 and 166 are both N-well layers.

Figure 1D:
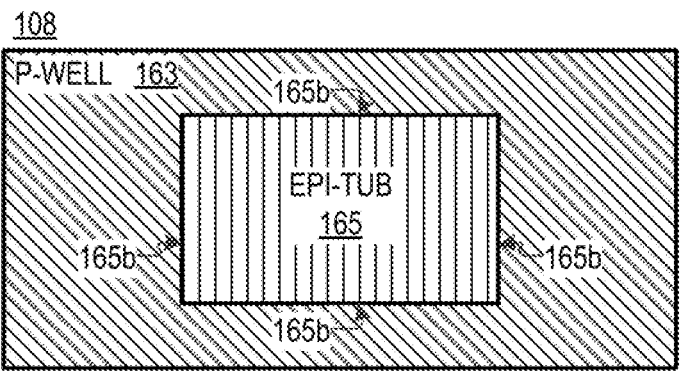
FIG. 1D is a partial top-down view of the isolator of FIG. 1C, according to aspects of the disclosure.

FIG. 1D shows a top-down view of the isolator 107 when the isolator 107 is viewed from a direction Z. FIG. 1D shows the isolator 107 with the dielectric layer 164, the STI layer 167, and the P-well layer 166 and removed. As illustrated in FIG. 1D, the epi tub layer 165 may be nested into P-well layer 163, such that the sidewalls 165b of the epi tub layer 165 are in contact with the P-well layer 163.

Figure 1E:
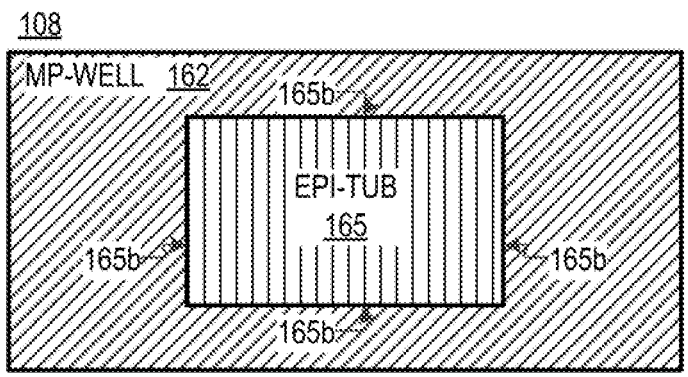
FIG. 1E is a partial top-down view of the isolator of FIG. 1C, according to aspects of the disclosure.

FIG. 1E shows a top-down view of the isolator 107 when the isolator 107 is viewed from direction Z. FIG. 1E shows the isolator 107 with the dielectric layer 164, the P-well layer 163, the STI layer 167, the P-well layer 166 removed. As illustrated in FIG. 1E and FIG. 1C, the epi tub layer 165 may also be nested into MP-well layer 162, such that the sidewalls 165b of the epi tub layer 165 are also in contact with the MP-well layer 162 and a bottom surface 165a of the epi tub layer 165 is in contact with the PBL layer 161.

Figure 1F:
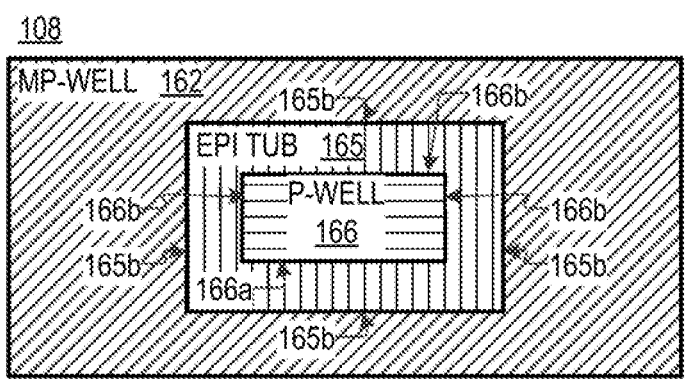
FIG. 1F is a top-down view of the isolator of FIG. 1C, according to aspects of the disclosure.

FIG. 1F shows a top-down view of the isolator 107 when the isolator 107 is viewed from direction Z. FIG. 1F shows the isolator 107 with the dielectric layer 164, and the STI layer 167 removed. As illustrated in FIG. 1F and FIG. 1C, the P-well layer 166 may be nested into the epi tub layer 165, such that a bottom surface 166a and sidewalls 166b of the P-well layer 166 are in contact with the epi tub layer 165.

Figure 1G:
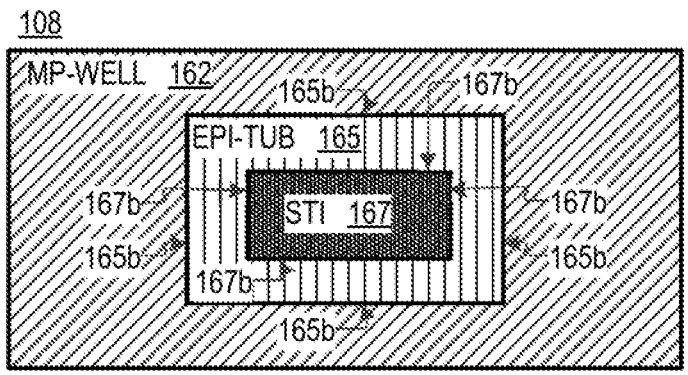
FIG. 1G is a top-down view of the isolator of FIG. 1C, according to aspects of the disclosure.

FIG. 1G shows a top-down view of the isolator 107 when the isolator 107 is viewed from direction Z. As illustrated, the STI layer 167 may be nested into the P-well layer 166, such that a bottom surface 167a and sidewalls 167b of the STI layer 167 are in contact with the P-well layer 166. Furthermore, as illustrated in FIG. 1C, the sidewalls 166b may be tapered.

Figure 1H:
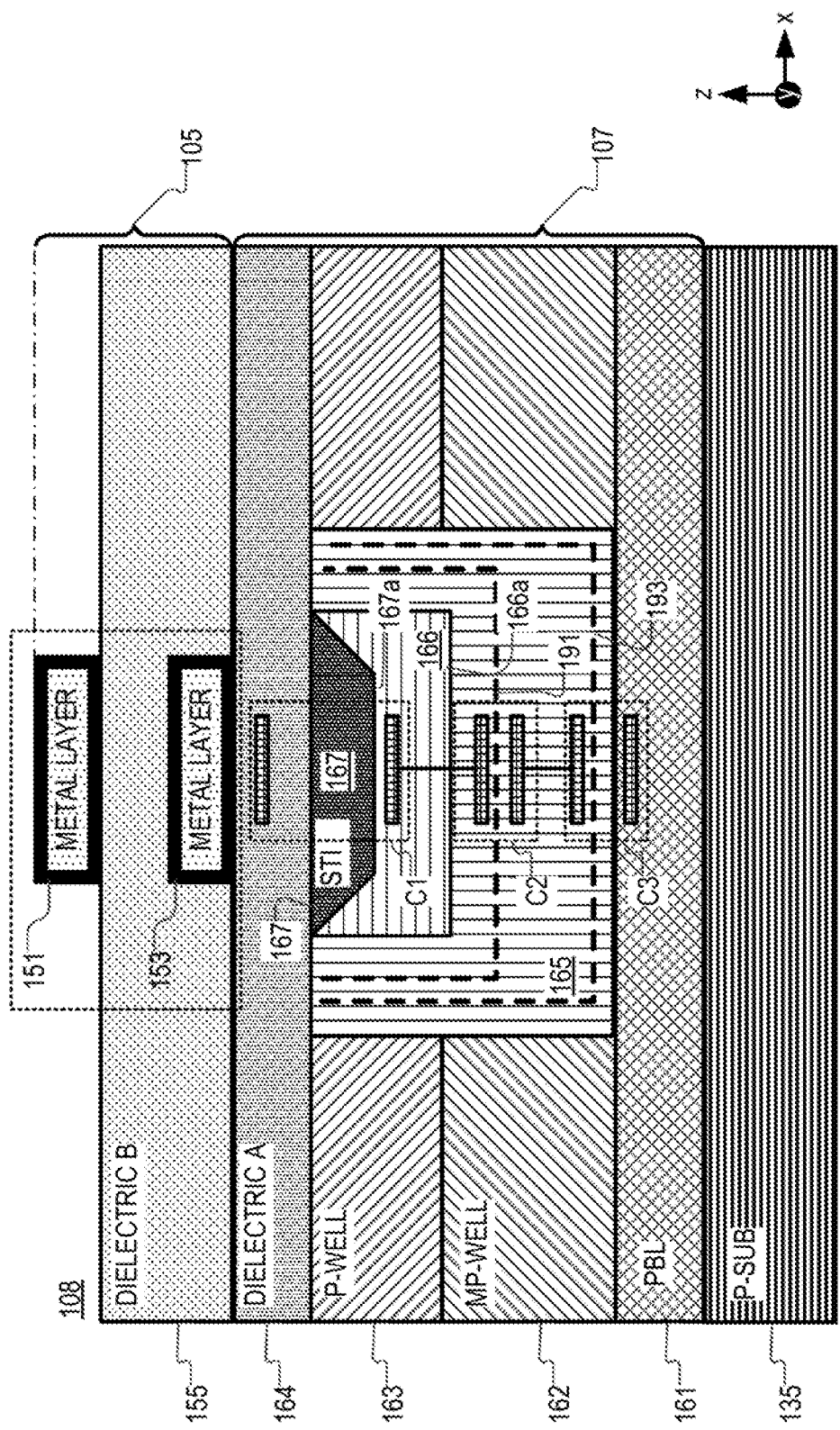
FIG. 1H is a schematic diagram illustrating the operation of the coupling capacitor and isolator of FIG. 1C, according to aspects of the disclosure.

FIG. 1H is a diagram illustrating the operation of the structure 108 in further detail. As illustrated, when the structure 108 is in use three equivalent (parasitic) capacitors may form that are connected in series and operate as a capacitive divider. These capacitors are herein referred to as a first equivalent capacitor C1, a second equivalent capacitor C2, and a third equivalent capacitor C3. As illustrated, the first equivalent capacitor C1 may form across STI layer 167, with charge accumulating on the metal layer 153 of the capacitor 105 and on the bottom surface 167a of the STI layer 167. The second equivalent capacitor C2 may form across a depletion layer 191, with charge accumulating on both sides of the depletion layer 191. The depletion layer 191 may be formed at the junction between the P-well layer 166 and the epi tub layer 165. The third equivalent capacitor C3 may form across the depletion layer 193, which charge accumulating on both sides of the depletion layer 193. The depletion layer 193 may be formed at the junction between the epi tub layer 165 and the PBL layer 161.

In some respects, the STI layer 167 are disposed underneath metal layer 153 of the capacitor 105 to minimize signal loss to coupling between the capacitor 105 and the substrate 135. The addition of the STI layer 167 increases the dielectric thickness between the plates of parasitic capacitor C1, effectively reducing the coupling capacitance of parasitic capacitor C1. The addition of the STI layer 167 reduces the overall parasitic capacitance between the dielectric layer 164 and the substrate 135 by creating a series of parasitic capacitances. This in turn may increase the resistance of the system 100 to common mode transient immunity (CMTI) events. Although in the example of FIGS. 1C-H, the layer 167 is an STI layer, alternative implementations are possible in which the layer 167 is a local oxidation of silicon (LOCOS) layer or another type of field oxide layer.

Figure 1I:
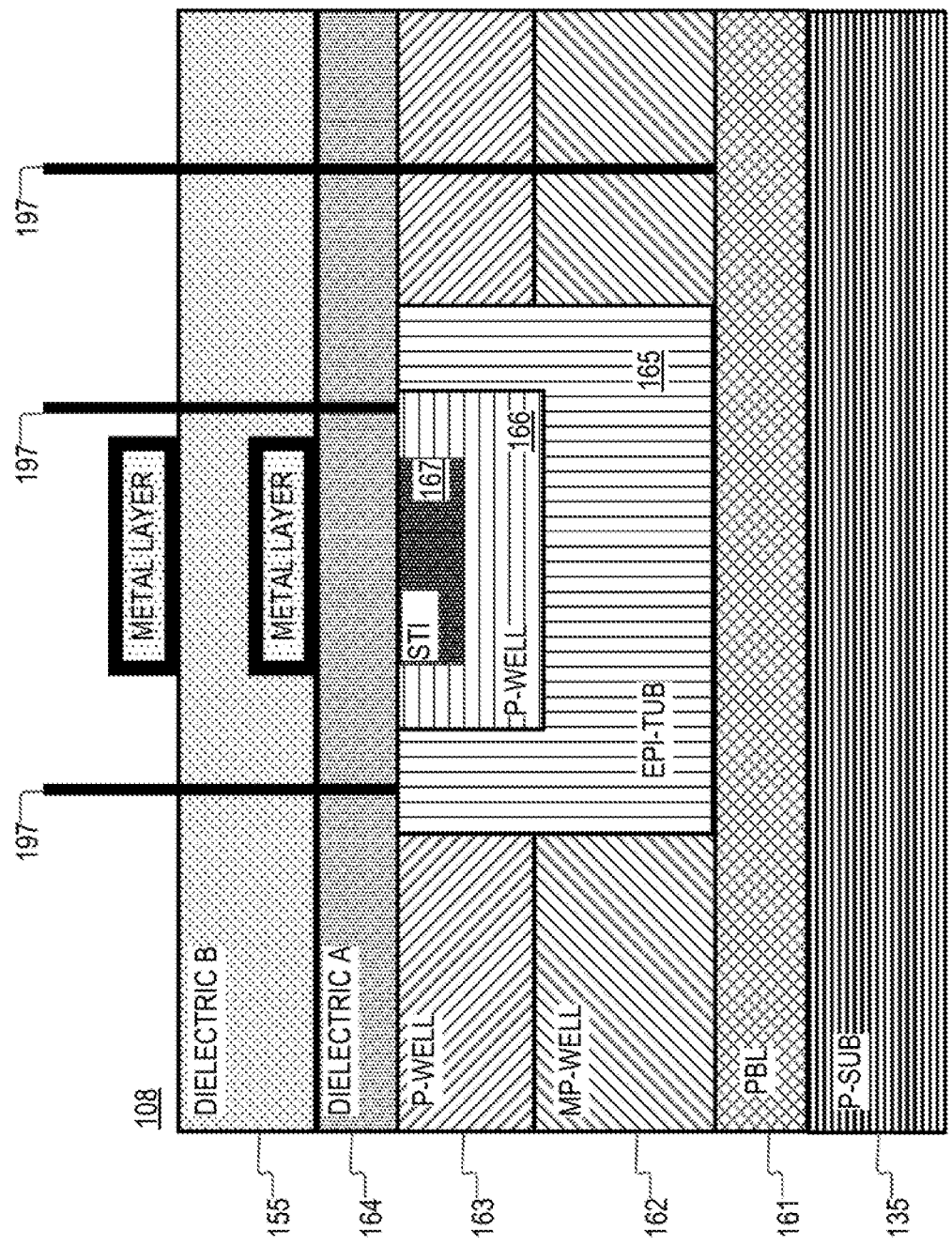
FIG. 1I is a diagram of the isolator and coupling capacitor of FIG. 1C, according to aspects of the disclosure.

FIG. 1I is a diagram of the structure 108, according to one particular implementation. In this example, the structure 108 is reverse-biased. Reverse biasing the structure 108 may include one or both of: (i) biasing the P-well layer 166 negatively with respect to the epi tub layer 165, and (ii) biasing the epi tub layer 161 negatively with respect to the PBL layer 161. If the P-well layer is biased negatively with respect to epi tub layer 165, the edge of depletion layer 191 (shown in FIG. 1H) will move further down to the epi tub layer 165 causing a reduction in junction capacitance (i.e., a reduction in the capacitance of equivalent capacitor C2). Similarly, if epi tub layer 165 is biased positively with respect to the PBL layer 161, the edge of depletion layer 193 will move further into the epi tub layer 165, causing a reduction in the capacitance of equivalent capacitor C3 (shown in FIG. 1H). To accomplish said biasing control, is necessary to provide electrical connections to the one or more the PBL layer 161, the epi tub layer 165, and the P-well layer 165. According to the example of FIG. 1G, metal contacts 197 are provided that run down to the top surface of each of the PBL layer 161, the epi tub layer 165, and the P-well layer 165. However, it will be understood that the present disclosure is not limited to any specific method for providing electrical connections to any of the PBL layer 161, the epi tub layer 165, and the P-well layer 165. In some implementations, and of the PBL layer 161, the epi tub layer 165, and the P-well layer 165 may be coupled (e.g., via contacts 197) to a power supply circuit (not shown) that is arranged to bias the layer as discussed above. The power supply circuit may be formed on the substrate 135 or provided separately.

Figure 2A:
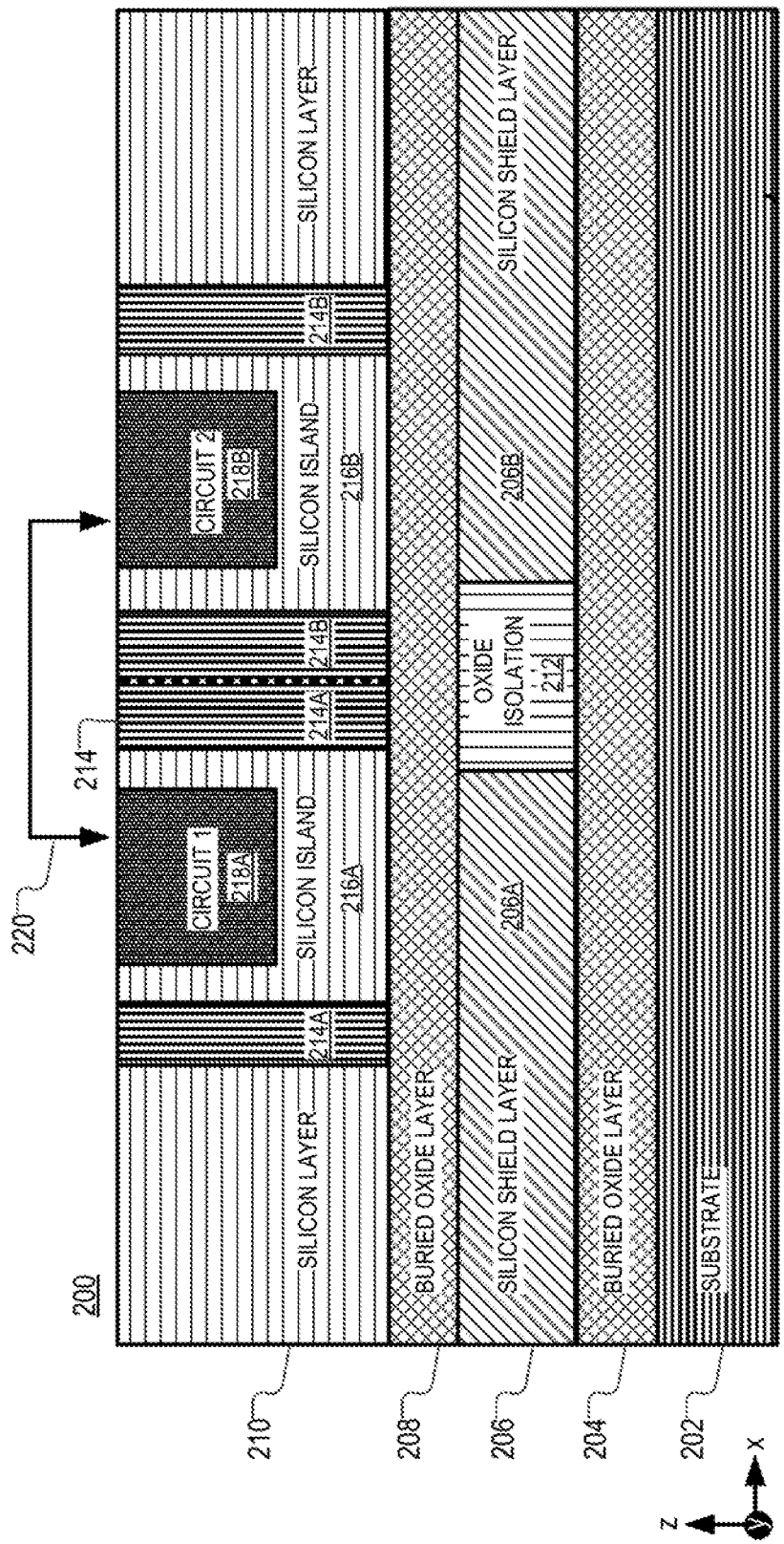
FIG. 2A is a schematic cross-sectional side view of an example of an apparatus, according to aspects of the disclosure.
Figure 2B:
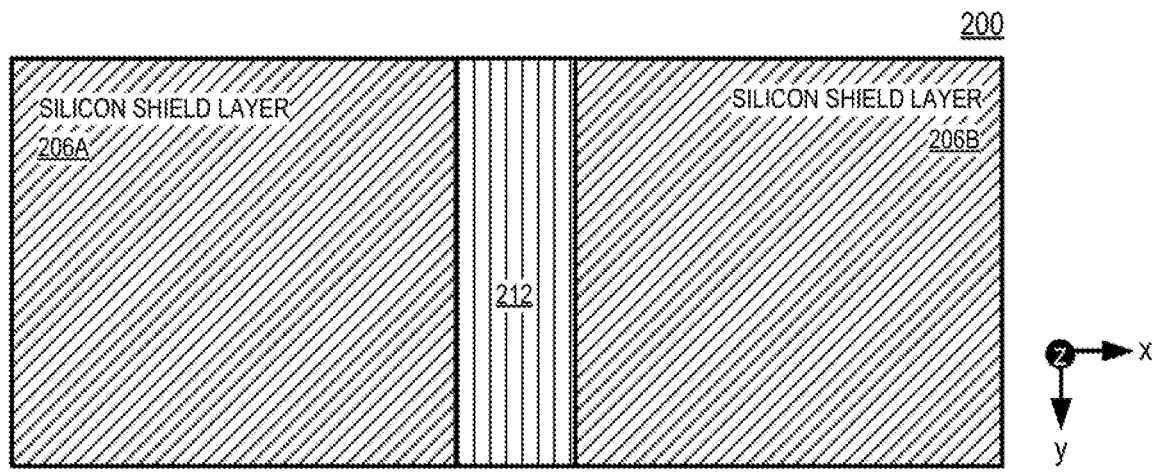
FIG. 2B is a partial schematic top-down view of the apparatus of FIG. 2A, according to aspects of the disclosure.
Figure 2C:
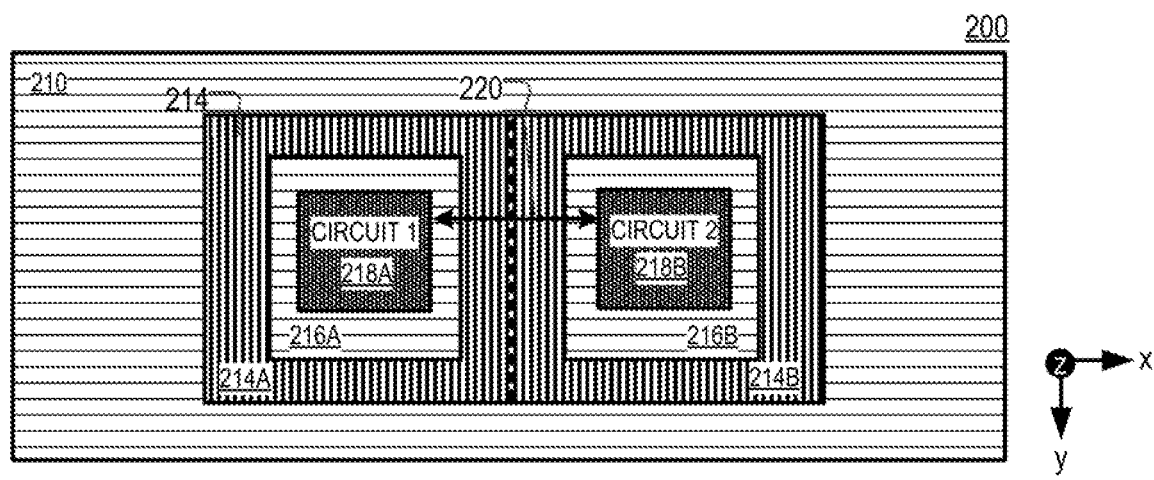
FIG. 2C is a schematic top-down view of the apparatus of FIG. 2A, according to aspects of the disclosure.

FIG. 2A-C shows an example of a semiconductor device 200, which includes a substrate 202, a buried oxide (BOX) layer 204, a silicon shield layer 206, a BOX layer 208, and a silicon layer 210. More particularly, FIG. 2A shows a cross-sectional side view of the semiconductor device 200 when the semiconductor device 200 is viewed from a direction Y. FIG. 2B shows a top-down view of the silicon shield layer 206 when the silicon shield layer 206 is viewed from a direction Z. And FIG. 2C shows a top-down view of the semiconductor device 200 when the semiconductor device 200 is viewed from direction Z.

As illustrated in FIG. 2A, the BOX layer 204 may be formed over the substrate 202. The silicon shield layer 206 may be formed over the BOX layer 204. The BOX layer 208 may be formed over the silicon shield layer 206. And the silicon layer 210 may be formed over the BOX layer 208. As illustrated in FIG. 2B, the silicon shield layer 206 may include a first portion 206a and a second portion 206b that are separated from one another by an oxide isolation layer 212. Furthermore, as illustrated in FIG. 2C, a trench structure 214 including a first oxide trench 214a and a second oxide trench 214b may be formed in the oxide isolation layer 212. The first oxide trench 214a and the second oxide trench 214b may define a first silicon island 216a and a second silicon island 216b in the silicon layer 210. A first electronic circuit 218a may be formed on the first silicon island 216a and a second electronic circuit 218b may be formed on the second silicon island 216b. The first electronic circuit 218a and the second electronic circuit 218b may be coupled via a signal line 220 (and/or any other suitable type of communications channel), as shown. The signal line 220 may be used for the exchange of digital (or analog) signals between the first electronic circuit 218a and the second electronic circuit 218b. The first electronic circuit 218a and the second electronic circuit 218b may include any suitable type of electronic circuitry. For example, in some implementations, the first electronic circuit 218a may include an electronic sensor (e.g., a pressure sensor, a magnetic field sensor, a light sensor, etc.), and the second electronic circuit 218b may include an interface for the electronic sensor.

Figure 2D:
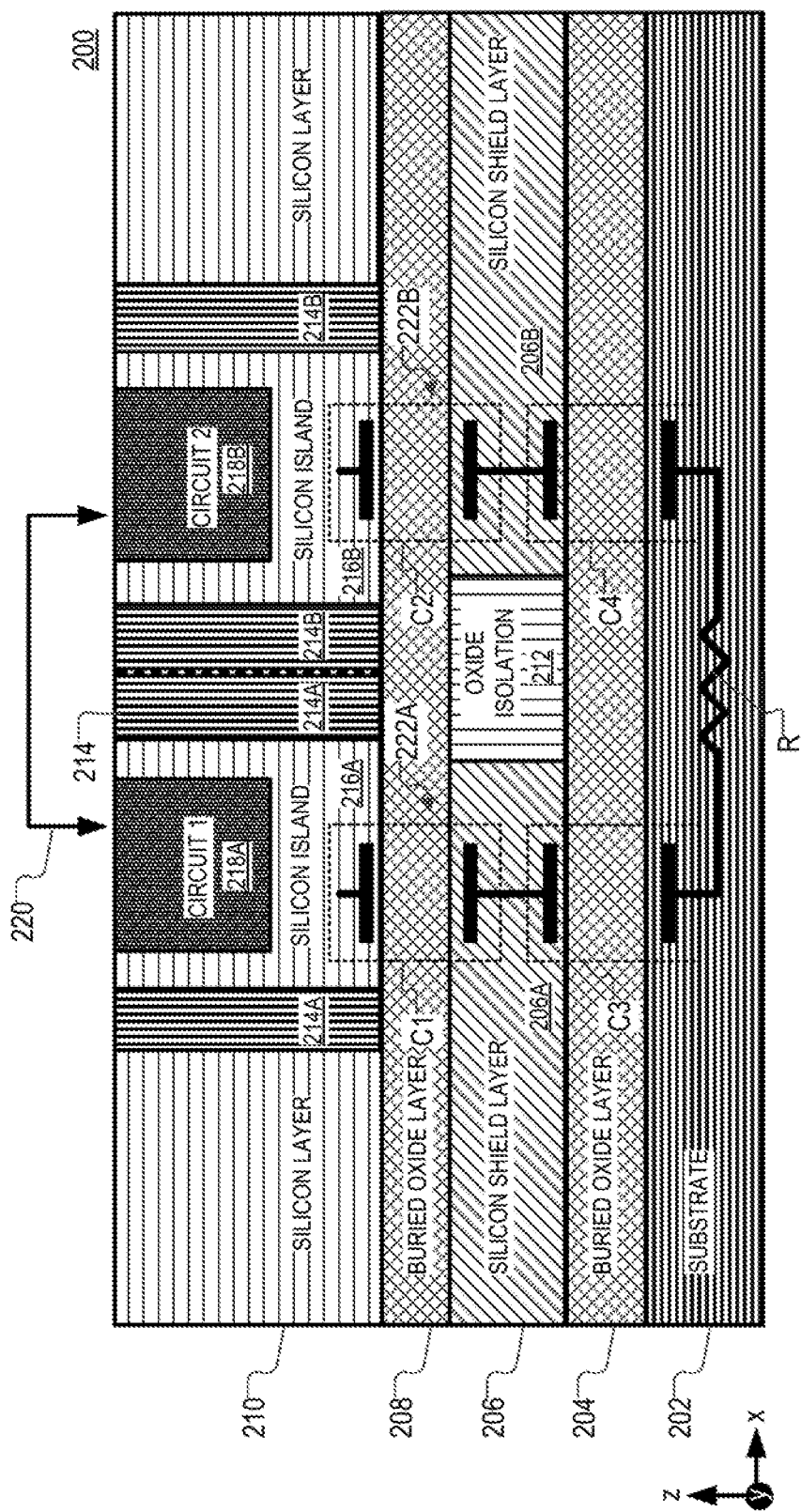
FIG. 2D is a diagram illustrating the operation of the apparatus of FIG. 2A, according to aspects of the disclosure.

FIG. 2D is a diagram illustrating the operation of the semiconductor device 200 in further detail. As illustrated in FIG. 2D, when the semiconductor device 200 is in use, an equivalent capacitor C1 may be formed underneath the first electronic circuit 218a, with charge accumulating on opposite sides of BOX layer 208. An equivalent capacitor C3 may also be formed underneath the first electronic circuit 218a, with charge accumulating on opposite sides of BOX layer 204. The equivalent capacitors C1 and C3 may be coupled to one another, via the first portion 206a of the silicon shield layer 206, to form a serial capacitor network 222a.

Furthermore, when the semiconductor device 200 is in use, an equivalent capacitor C2 may be formed underneath the second electronic circuit 218b, with charge accumulating on opposite sides of BOX layer 208. An equivalent capacitor C4 may also be formed underneath the first electronic circuit 218a, with charge on opposite sides of BOX layer 204. The equivalent capacitors C2 and C4 may be coupled to one another, via the second portion 206b of the silicon shield layer 206, to form a serial capacitor network 222b. The serial capacitor network 222a may be coupled to the serial capacitor network 222b via the equivalent resistance R of the substrate 202.

In some respects, the configuration of the semiconductor device 200 may result in a reduced effective coupling capacitance between the circuits 218A/218B and the substrate 202, thus causing a decrease of noise cross-coupling between the first and second electronic circuits. More specifically, the layers under the first electronic circuit 218a and the second electronic circuit 218b form multiple serially-coupled equivalent capacitors, rather than a single equivalent capacitor, which effectively causes their total parasitic capacitance to be reduced.

Figure 3A:
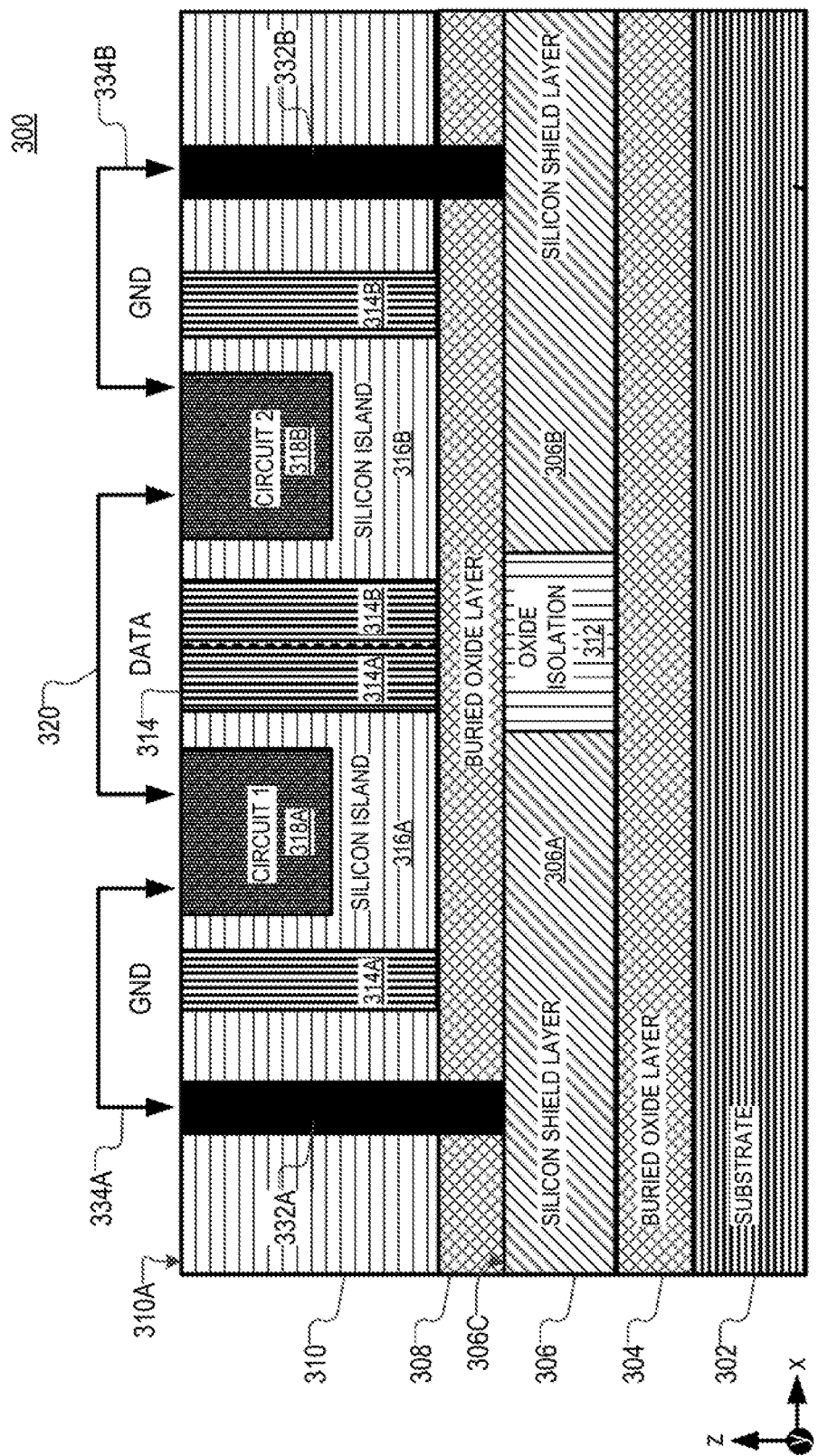
FIG. 3A is a schematic cross-sectional side view of an example of an apparatus, according to aspects of the disclosure.
Figure 3B:
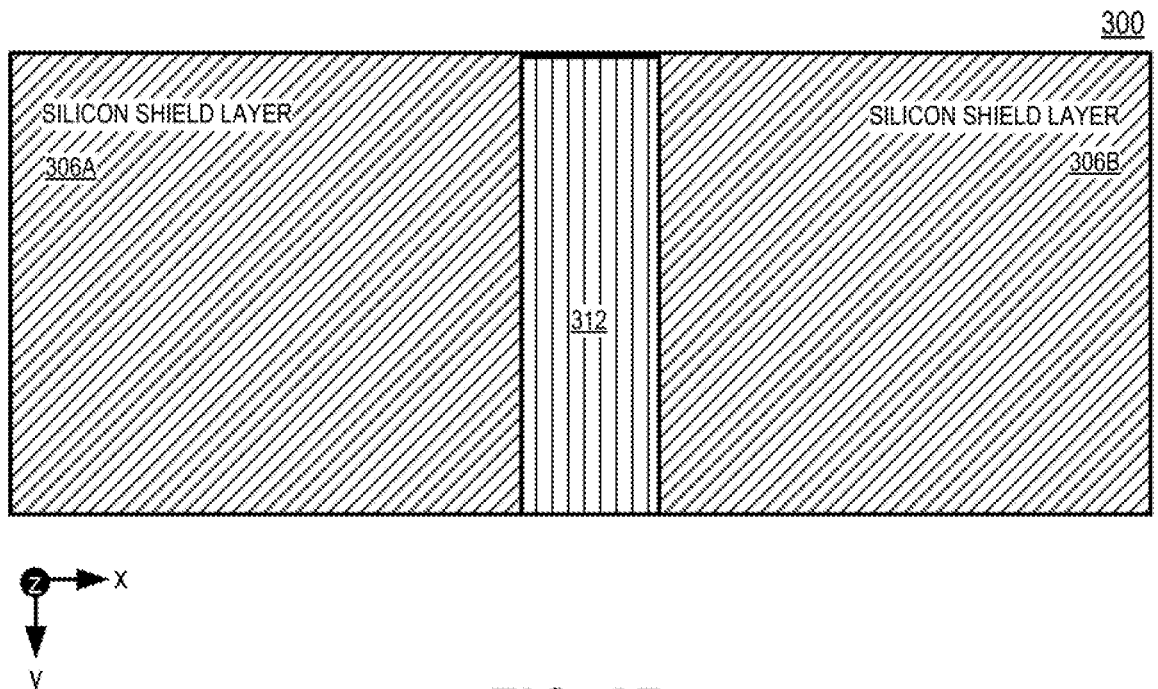
FIG. 3B is a partial schematic top-down view of the apparatus of FIG. 3A, according to aspects of the disclosure.
Figure 3C:
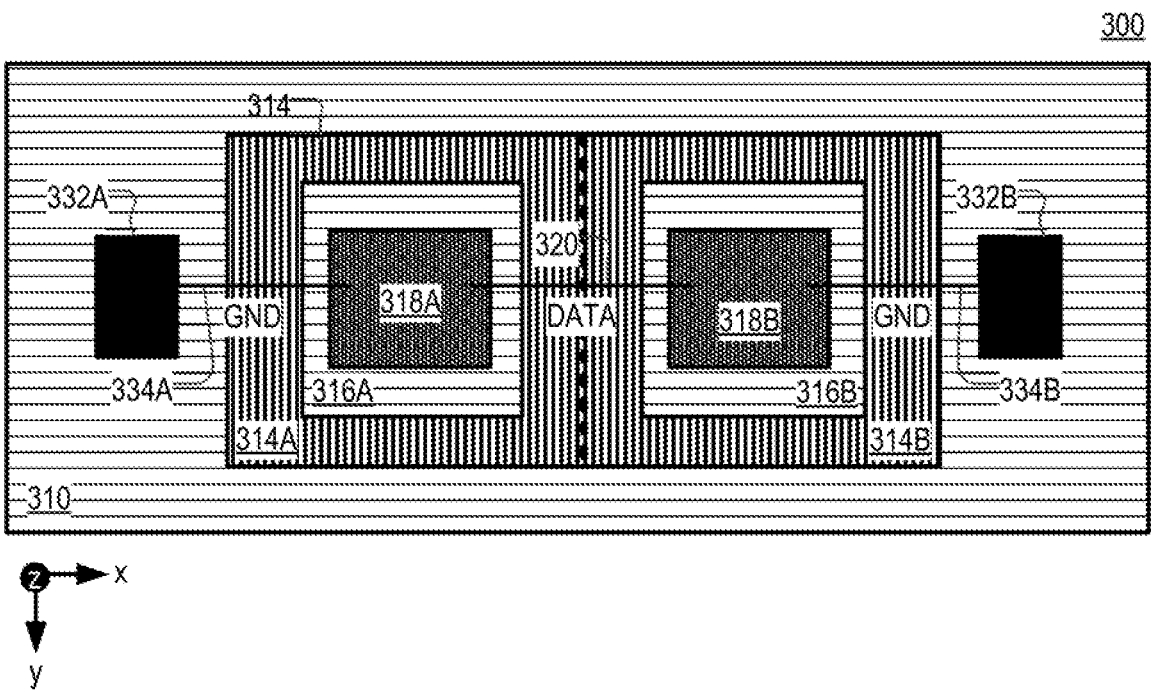
FIG. 3C is a schematic top-down view of the apparatus of FIG. 3A, according to aspects of the disclosure.

FIGS. 3A-C show a semiconductor device 300 including a substrate 302, a buried oxide (BOX) layer 304, a silicon shield layer 306, a BOX layer 308, and a silicon layer 310. More particularly, FIG. 3A shows a cross-sectional side view of the semiconductor device 300 when the semiconductor device 300 is viewed from a direction Y. FIG. 3B shows a top-down view of the silicon shield layer 306 when the silicon shield layer 306 is viewed from a direction Z. And FIG. 3C shows a top-down view of the semiconductor device 300 when the semiconductor device 300 is viewed from direction Z.

As illustrated in FIG. 3A, the BOX layer 304 may be formed over the substrate 302. The silicon shield layer 306 may be formed over the BOX layer 304. The BOX layer 308 may be formed over the silicon shield layer 306. And the silicon layer 310 may be formed over the BOX layer 308. As illustrated in FIG. 3B, the silicon shield layer 306 may include a first portion 306a and a second portion 306b that are separated from one another by an oxide isolation layer 312. Furthermore, as illustrated in FIG. 3C, a trench structure 314 including a first oxide trench 314a and a second oxide trench 314b may be formed in the silicon layer 310. The first oxide trench 314a and the second oxide trench 314b may define a first silicon island 316a and a second silicon island 316b in the silicon layer 310. A first electronic circuit 318a may be formed on the first silicon island 316a and a second electronic circuit 318b may be formed on the second silicon island 316b. The first electronic circuit 318a and the second electronic circuit 318b may be coupled via a signal line 320 (and/or any other suitable type of communications channel). The signal line 320 may be used for the exchange of digital (or analog) signals between the first electronic circuit 318a and the second electronic circuit 318b. The first electronic circuit 318a and the second electronic circuit 318b may include any suitable type of electronic circuitry. For example, in some implementations, the first electronic circuit 318a may include an electronic sensor (e.g., a pressure sensor, a magnetic field sensor, a light sensor, etc.), and the second electronic circuit 318b may include an interface for the electronic sensor.

A first conductive via 332a may be formed in the silicon layer 310 that extends from a top surface 310a of the silicon layer 310 to a top surface 306c of the first portion 306a of the silicon shield layer 306. The first conductive via 332a may be formed of any suitable type of conductive material. The first conductive via 332a may extend through the BOX layer 308, and it may be electrically coupled to a ground source of the first electronic circuit 318a via a ground line 334a.

A second conductive via 332b may be formed in the silicon layer 310 that extends from to the top surface 310a of the silicon layer 310 to a top surface 306d if the second portion 306b of the silicon shield layer 306. The second conductive via 332b may be formed of any suitable type of conductive material. The second conductive via 332b may extend through the BOX layer 308, and it may be electrically coupled to a ground source of the second electronic circuit 318b via a ground line 334b.

Figure 3D:
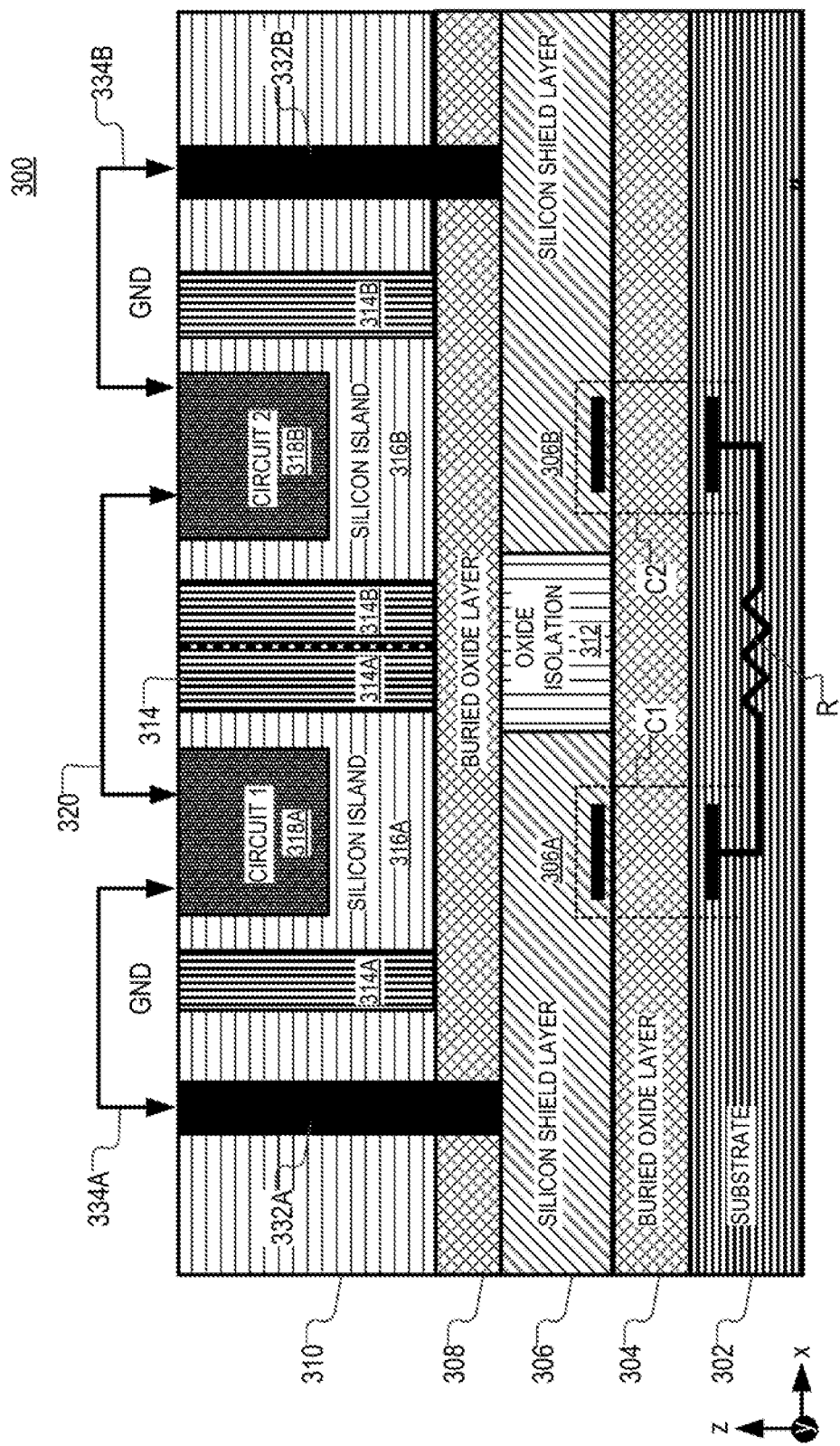
FIG. 3D is a diagram illustrating the operation of the apparatus of FIG. 3A, according to aspects of the disclosure.

FIG. 3D is a diagram illustrating the operation of the semiconductor device 300 in further detail. As illustrated in FIG. 3D, an equivalent capacitor C1 may be formed underneath the first electronic circuit 318a, with charge accumulating on opposite sides of the BOX layer 304. Furthermore, an equivalent capacitor C2 may be formed underneath the second electronic circuit 318b, with charge accumulating on opposite sides of the BOX layer 304. The equivalent capacitors C1 and C2 can be coupled to one another via the equivalent resistance R of the substrate 302. However, because the ground potentials of the first electronic circuit 318a and the second electronic circuit 318b are coupled to the first conductive via 332a and the second conductive via 332b, respectively, the parasitic capacitance of the semiconductor device 300 (which is represented by capacitors C1 and C2) will not lead to cross-coupling between the first electronic circuit 318a and the second electronic circuit 318b.

Figure 4A:
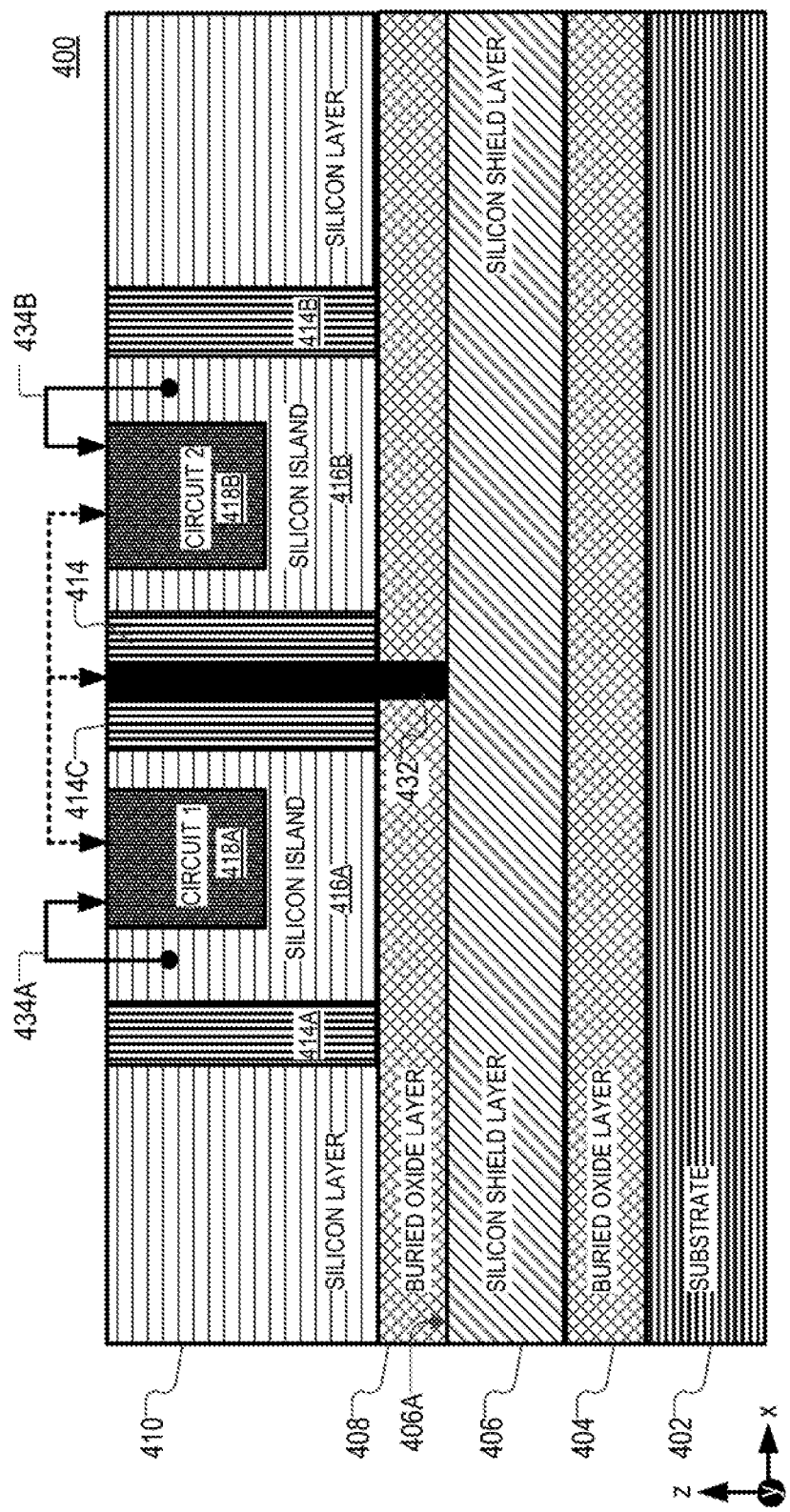
FIG. 4A is a schematic cross-sectional side view of an example of an apparatus, according to aspects of the disclosure.
Figure 4B:
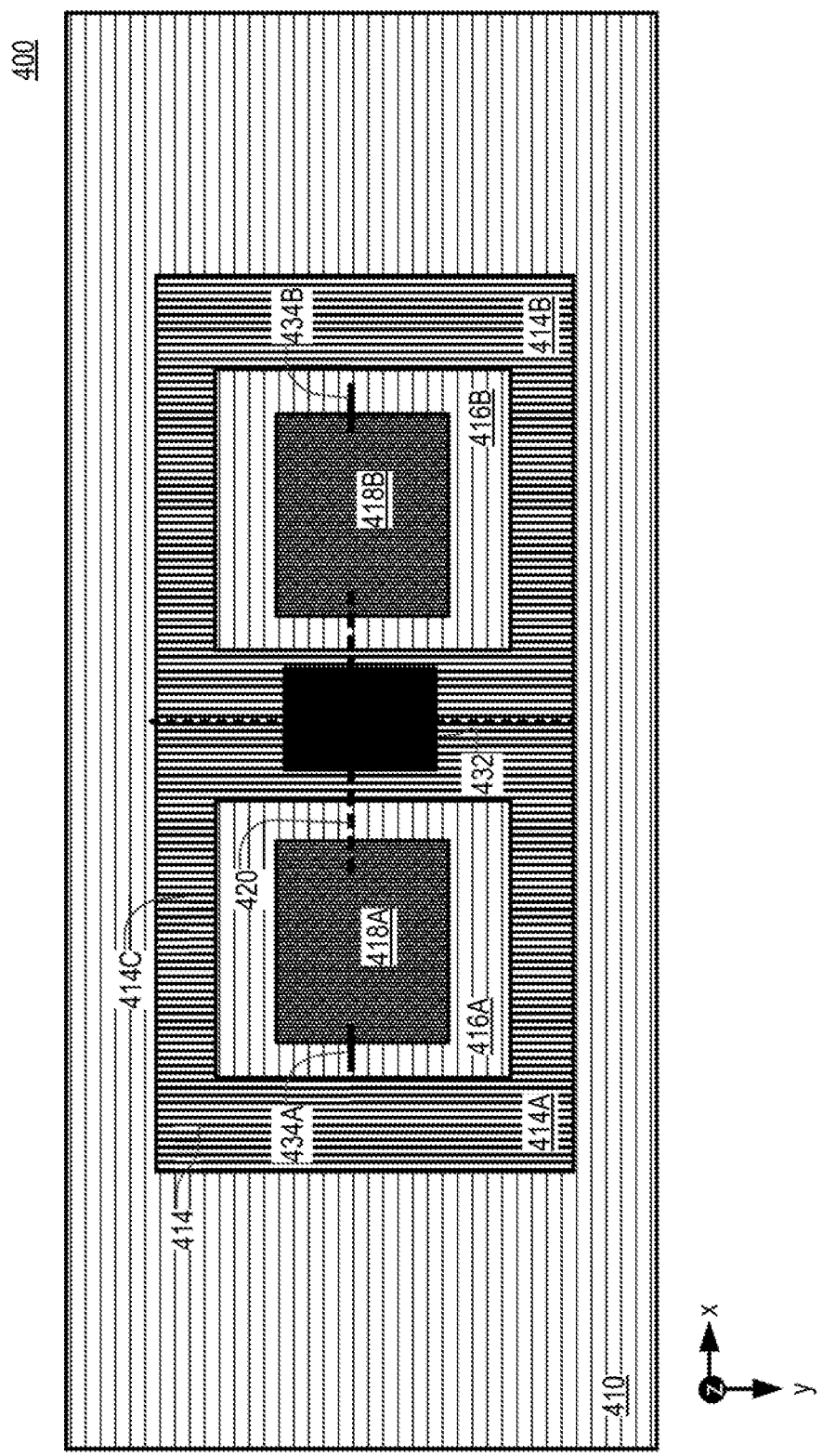
FIG. 4B is a partial schematic top-down view of the apparatus of FIG. 4A, according to aspects of the disclosure.

FIGS. 4A-B show a semiconductor device 400 including a substrate 402, a buried oxide (BOX) layer 404, a silicon shield layer 406, a BOX layer 408, and a silicon layer 410. More particularly, FIG. 4A shows a cross-sectional side view of the semiconductor device 400 when the semiconductor device 400 is viewed from a direction Y, and FIG. 4B shows a top-down view of the semiconductor device 300 when the semiconductor device 300 is viewed from a direction Z.

As illustrated in FIG. 4A, the BOX layer 404 may be formed over the substrate 402. The silicon shield layer 406 may be formed over the BOX layer 404. The BOX layer 408 may be formed over the silicon shield layer 406. And the silicon layer 410 may be formed over the BOX layer 408. A trench structure 414 including a first oxide trench 414a and a second oxide trench 414b may be formed in the silicon layer 410. The first oxide trench 414a and the second oxide trench 414b may define a first silicon island 416a and a second silicon island 416b in the silicon layer 410. A conductive via 432 may be formed in the trench structure 414. The conductive via 432 may extend from a top surface 414c of the trench structure 414 to a top surface of the silicon shield layer 406. The conductive via 432 may extend through the trench structure 414, in other words. The conductive via 432 may be formed of any suitable type of conductive material.

A first electronic circuit 418a may be formed on the first silicon island 416a and a second electronic circuit 418b may be formed on the second silicon island 416b. The first electronic circuit 418a and the second electronic circuit 418b may be electrically coupled to one another, and to the conductive via 432, by via capacitive coupling (or another type of non-direct coupling), as indicated by the dashed arrows in FIG. 4A.

The first electronic circuit 418a may be electrically coupled to the body of the first silicon island 416a by a first reference signal line 434a. The second electronic circuit 418b may be electrically coupled to the body of the second silicon island 416b by a second reference signal line 434b. The first electronic circuit 418a and the second electronic circuit 418b may exchange digital (or analog) signals via the signal line 420. The first electronic circuit 418a may perform active noise cancelation on a first data signal that is received over signal line 420 from the second electronic circuit 418b. The active noise cancellation may be performed by the first electronic circuit 418a based on a first reference signal that is received over the first reference signal line 434a. The second electronic circuit 418b may perform active noise cancelation on a second data signal that is received over signal line 420 from the first electronic circuit 418a. The active noise cancelation may be performed by the second electronic circuit 418b based on a second reference signal that is received over the second reference signal line 434b. In some implementations, the first electronic circuit 418a and/or first silicon island 416a may be capacitively coupled to the silicon shield layer 406 and arranged to inject noise into that layer. When the voltage of the first electronic circuit 418a and/or first silicon island 416a increases abruptly, relative to the substrate 402, the first electronic circuit 418a and/or first silicon island 416a will capacitively pull the silicon shield layer 406 to a more positive potential. In some implementations, active circuitry within the first electronic circuit 418a may be configured to counteract that action by generating a pulse of negative polarity that is coupled through via 432a directly into the silicon shield layer 406 to at least partially compensate the positive pull.

Figure 4C:
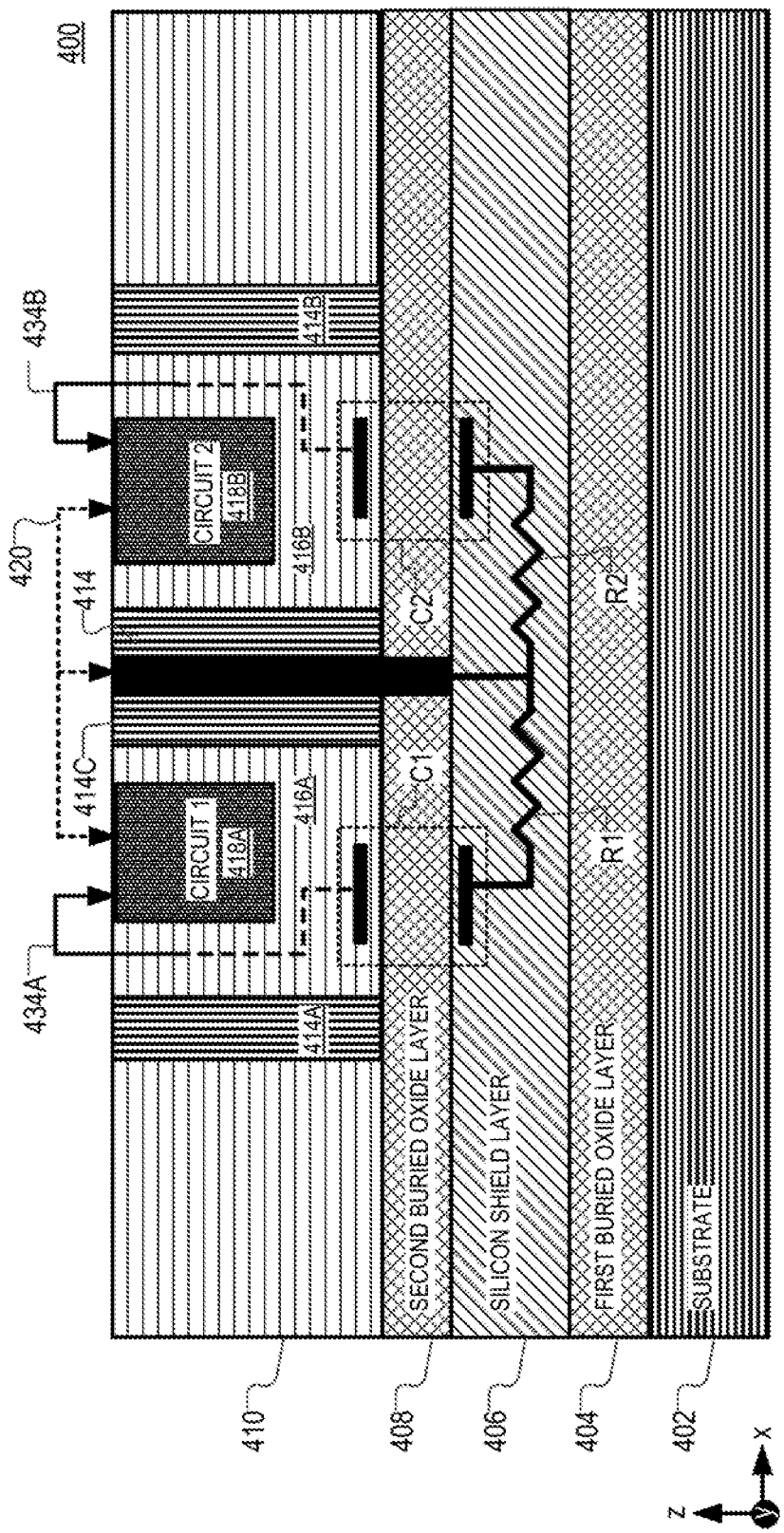
FIG. 4C is a diagram illustrating the operation of the apparatus of FIG. 4A, according to aspects of the disclosure.
Figure 1A:
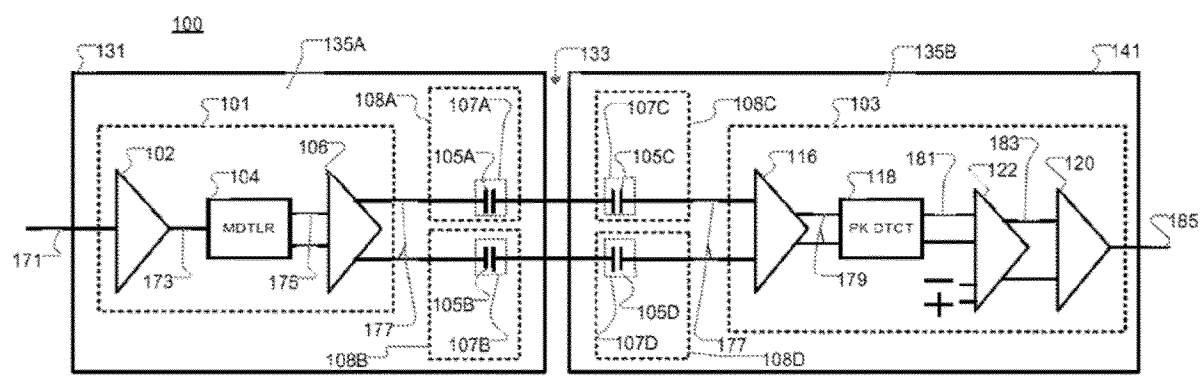

FIG. 4C is a diagram illustrating the operation of the semiconductor device 400 in further detail. As illustrated, in FIG. 4C, an equivalent capacitor C1 may be formed underneath the first electronic circuit 418a, with charge accumulating on both sides of the BOX layer 408. An equivalent capacitor C2 may also be formed underneath the second electronic circuit 418b, with charge accumulating on both sides of the BOX layer 408. The bottom plates of equivalent capacitors C1 and C2 may be coupled to one another, via the equivalent resistances R1 and R2 of the silicon shield layer. The equivalent resistances R1 and R2 of the silicon shield layer 406 may be electrically coupled to the conductive via 432, as shown. The top plate of equivalent capacitor C1 may be coupled to the first reference signal line 434a, and the top plate of equivalent capacitor C2 may be coupled electrically coupled to the second reference signal line 434b.

The system may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). Each such program may be implemented in a high-level procedural or object-oriented programming language to work with the rest of the computer-based system. However, the programs may be implemented in assembly, machine language, or Hardware Description Language. The language may be a compiled or an interpreted language, and it may be deployed in any form, including as a stand-alone program or as a module, component, subroutine, or another unit suitable for use in a computing environment. A computer program may be deployed to be executed on one computer or multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, volatile memory, magnetic diskette and so forth but does not include a transitory signal per se.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

The invention claimed is:

1. An apparatus, comprising:
   a substrate;
   a coupling capacitor that is formed over the substrate; and
   an isolator that is formed between the substrate and the coupling capacitor, the isolator including: (a) an MP-well layer, (b) a first well layer, (c) an epi tub layer that is nested in the MP-well layer and the first well layer, and (d) a second well layer that is nested in the epi tub layer.

2. The apparatus of claim 1, wherein the first well layer is a P-well layer and the second well layer is a P-well layer.

3. The apparatus of claim 1, wherein the first well layer is an N-well layer and the second well layer is an N-well layer.

4. The apparatus of claim 1, wherein the second well layer is biased negatively with respect to the epi tub layer.

5. The apparatus of claim 1, further comprising a PBL layer that is formed between the isolator and the substrate, wherein the epi tub layer is biased positively with respect to the PBL layer.

6. The apparatus of claim 1, further comprising an electronic circuit that is formed over the substrate, the electronic circuit being coupled to the coupling capacitor.

7. An apparatus, comprising:
   a substrate;
   a coupling capacitor that is formed over the substrate; and
   an isolator that is formed between the substrate and the coupling capacitor, the isolator including: (a) an MP-well layer, (b) a first well layer, (c) an epi tub layer that is nested in the MP-well layer and the first well layer, and (d) a second well layer that is nested in the epi tub layer.

8. The apparatus of claim 7, further comprising an electronic circuit that is formed over the substrate, the electronic circuit being coupled to the coupling capacitor.

9. The apparatus of claim 7, wherein the isolator further includes a field oxide layer that is nested in the n-well layer.

10. The apparatus of claim 7, wherein the isolator further includes a field oxide layer that is nested in the n-well layer and the coupling capacitor is formed over the field oxide layer.

11. The apparatus of claim 7, wherein the field oxide layer includes a bottom surface and a plurality of sidewalls, each of the bottom surface and the plurality of sidewalls being adjacent to the epi tub layer.

12. The apparatus of claim 7, further comprising a dielectric layer that is disposed between the isolator and the coupling capacitor.

13. The apparatus of claim 7, further comprising a PBL layer that is formed between the isolator and the substrate.

* * * * *

UNITED STATES PATENT AND TRADEMARK OFFICE
CERTIFICATE OF CORRECTION

| | | |
|---|---|---|
| PATENT NO. | : 11,515,246 B2 | Page 1 of 3 |
| APPLICATION NO. | : 17/067178 | |
| DATED | : November 29, 2022 | |
| INVENTOR(S) | : Sundar Chetlur et al. | |

It is certified that error appears in the above-identified patent and that said Letters Patent is hereby corrected as shown below:

In the Drawings

FIG. 1A, the second instance of reference numeral 105A should be replaced with the reference numeral 105B as shown on the attached drawing sheet.

In the Specification

Column 1, Line 38 delete "island a" and replace with --island, and a--.

Column 2, Line 54 delete "105" and replace with --105A, B--.

Column 2, Line 62 delete "107A" and replace with --107C--.

Column 2, Line 65 delete "107B" and replace with --107D--.

Column 3, Line 2 delete "105" and replace with --105C, D--.

Column 3, Line 31 delete "105" and replace with --105A-D--.

Column 3, Line 32 delete "105" and replace with --105A-D--.

Column 3, Line 33 delete "insulator between" and replace with --insulator in between--.

Column 3, Line 40 delete "105" and replace with --105A-D--.

Column 3, Line 51 delete "105" and replace with --105A-D--.

Column 3, Line 53 delete "105" and replace with --105A-D--.

Signed and Sealed this
Fourteenth Day of January, 2025

Derrick Brent
*Acting Director of the United States Patent and Trademark Office*

CERTIFICATE OF CORRECTION (continued)
U.S. Pat. No. 11,515,246 B2

Column 3, Line 54 delete "107" and replace with --107A-D--.

Column 4, Line 2 delete "105A-B" and replace with --105A-D--.

Column 4, Line 24 delete "and removed." and replace with --removed.--.

Column 4, Line 66 delete ", which charge" and replace with --; with charge--.

Column 5, Line 3 delete "are" and replace with --is--.

Column 5, Line 24 delete "161" and replace with --165--.

Column 5, Line 34 delete "is" and replace with --,it is--.

Column 5, Line 36 delete "more the PBL" and replace with --more of the PBL--.

Column 5, Line 37 delete "layer 165." and replace with --layer 163--.

Column 5, Line 37 delete "FIG. 1G," and replace with --FIG. 1I--.

Column 5, Line 40 delete "165." and replace with --163.--.

Column 5, Line 43 delete "165." and replace with --163.--.

Column 5, Line 45 delete "165." and replace with --163.--.

Column 5, Line 50 delete "FIG. 2A-C" and replace with --FIGS. 2A-C--.

Column 6, Line 39-40 delete "first electronic circuit 218a" and replace with --second electronic circuit 218b--.

Column 7, Line 40 delete "from to the" and replace with --from the--.

Column 7, Line 41 delete "306d if" and replace with --306c of--.

Column 8, Line 30 delete ", by via" and replace with --,by--.

Column 9, Line 7 delete "layer" and replace with --layer 406,--.